United States Patent [19]

Yoshida et al.

[11] Patent Number: 5,219,765
[45] Date of Patent: Jun. 15, 1993

[54] METHOD FOR MANUFACTURING A SEMICONDUCTOR DEVICE INCLUDING WAFER AGING, PROBE INSPECTION, AND FEEDING BACK THE RESULTS OF THE INSPECTION TO THE DEVICE FABRICATION PROCESS

[75] Inventors: Toru Yoshida, Yomato; Suguru Sakaguchi, Chigasaki; Aizo Kaneda, Shimodate; Kooji Serizawa, Fujisawa; Munehisa Kishimoto, Kamakura; Masaaki Mutoh; Kunio Matsumoto, both of Yokohama; Isao Ohomori, Tokyo; Shingo Yorisaki, Tachikawa, all of Japan

[73] Assignee: Hitachi, Ltd., Tokyo, Japan

[21] Appl. No.: 549,069

[22] Filed: Jul. 6, 1990

[51] Int. Cl.⁵ .............................. H01L 21/66
[52] U.S. Cl. ..................... 437/8; 148/DIG. 162; 324/500; 324/158 R; 324/158 P; 324/158 T
[58] Field of Search ............... 437/8; 324/500, 158 R, 324/158 P, 158 T; 148/DIG. 162

[56] References Cited

U.S. PATENT DOCUMENTS

| | | | |
|---|---|---|---|
| 4,607,219 | 8/1986 | Isosaka | 437/8 |
| 4,751,656 | 6/1988 | Conti et al. | 364/488 |
| 4,801,869 | 1/1989 | Sprogis | 324/158 R |
| 4,853,628 | 8/1989 | Gouldsberry et al. | 324/158 R |
| 4,985,988 | 1/1991 | Littlebury | 437/217 |

FOREIGN PATENT DOCUMENTS

| | | |
|---|---|---|
| 0116144 | 6/1985 | Japan . |
| 0167343 | 8/1985 | Japan . |
| 0143436 | 6/1987 | Japan . |
| 221126 | 9/1987 | Japan . |
| 0287637 | 12/1987 | Japan . |
| 0293629 | 12/1987 | Japan . |
| 0204621 | 8/1988 | Japan . |

Primary Examiner—Mary Wilczewski
Attorney, Agent, or Firm—Antonelli, Terry, Stout & Kraus

[57] ABSTRACT

The present invention provides a method for manufacturing a highly reliable semiconductor device without waste by incorporating predetermined functions into a wafer in a wafer completion process, aging the wafer in a wafer aging process, distinguishing between non-defective and defective chips in a probe inspection process, separating chips in the wafer one by one in a dicing process, sorting out the chips into non-defective and defective chips in a selection process, then analyzing failure information and feeding back the result of the analysis to the wafer completion process in a feedback process, thereby quickly analyzing and repairing a failure process on reliability in the wafer completion process.

22 Claims, 11 Drawing Sheets

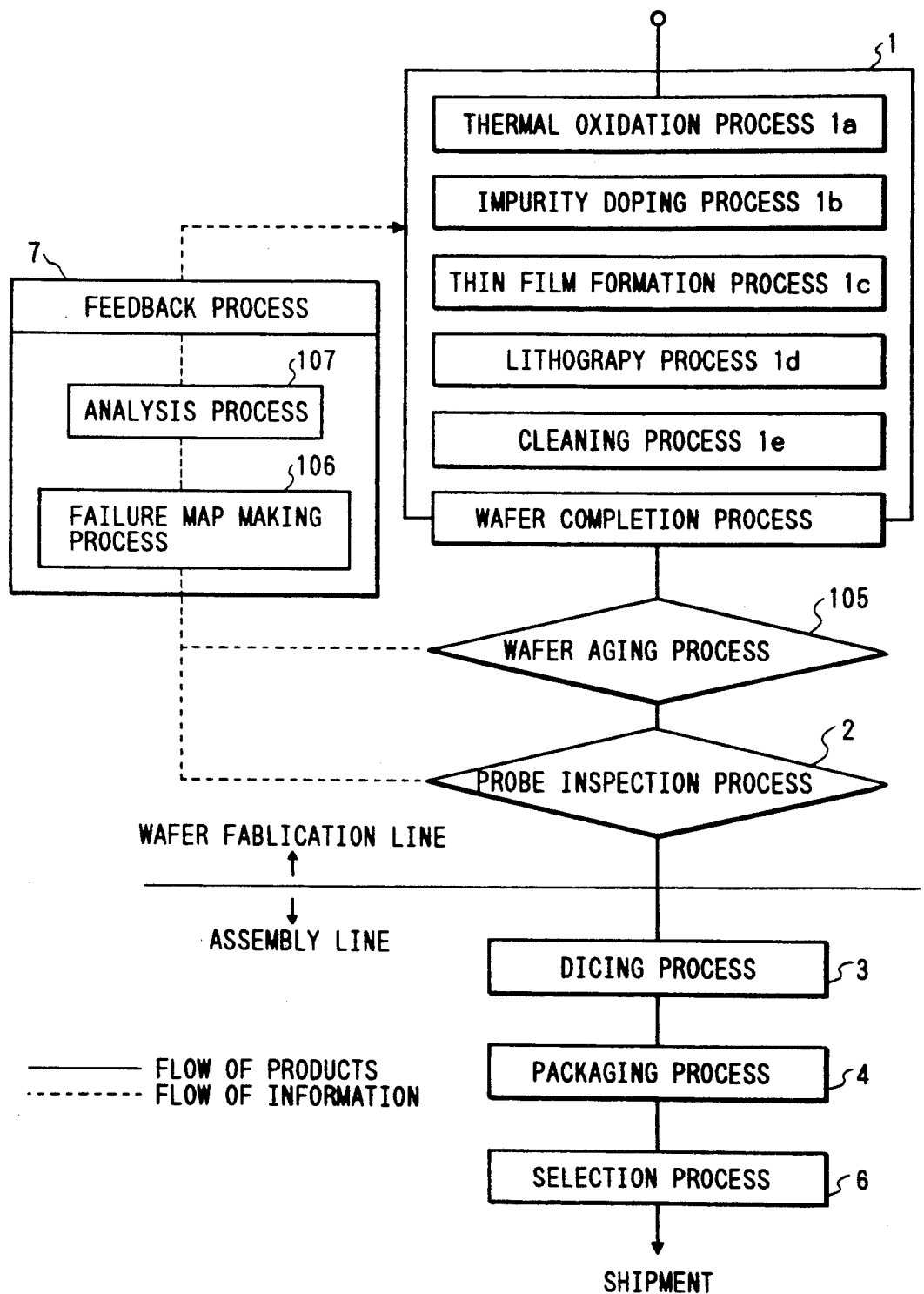

FIG. 9

| FAILURE MODE | CAUSE IN CIRCUIT | CAUSE IN PROCESS |
|---|---|---|
| A:"1" FIXED | A-1:DESTRUCTION OF MOS TRANSISTOR GATE | A-1-1:PLASMA DAMAGE |
| | | A-1-2:ION INPLANTATION DAMAGE |
| | | A-1-3:PARTICLES |
| | A-2:SHORTAGE BETWEEN GATE PLATE AND CAPACITOR PLATE | A-2-1:PARTICLES |
| | | A-2-2:PLASMA ETCHING RESIDUE |
| B:DESTRUCTION OF MEMORY CAPACITOR | B-1:DESTRUCTION OF CAPACITOR DIELECTRIC | B-1-1:PARTICLES |
| | | B-1-2:PLASMA DAMAGE |
| | | B-1-3:ION INPLANTATION DAMAGE |

FIG. 10

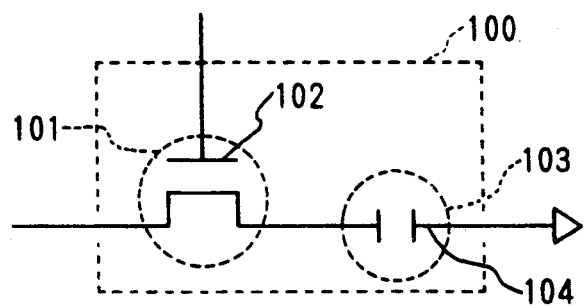

METHOD FOR MANUFACTURING A SEMICONDUCTOR DEVICE INCLUDING WAFER AGING, PROBE INSPECTION, AND FEEDING BACK THE RESULTS OF THE INSPECTION TO THE DEVICE FABRICATION PROCESS

BACKGROUND OF THE INVENTION

1. Field of the Invention

The present invention relates to a method for manufacturing a semiconductor device and particularly to a semiconductor device manufacturing method involving conducting wafer aging in the course of manufacture of the semiconductor device, then making probe inspection, and feeding back the results of the inspection to a wafer fabrication process.

2. Description of the Prior Art

The conventional semiconductor device manufacturing process will now be described with reference to FIG. 8. The semiconductor device manufacturing process is broadly divided into a wafer fabrication line and an assembly line. The wafer fabrication line comprises a wafer completion process 1 for incorporating predetermined circuit functions into a wafer and a probe inspection process 2 for inspecting the operation of LSI chips in the wafer one by one, followed by the assembly line. The wafer completion process 1 mainly comprises a thermal oxidation process 1a typified by a thermal oxidation of silicon (Si), an impurity doping process 1b typified by ion implantation, a thin film formation process 1c typified by sputtering deposition of aluminum (Al) which utilizes a high-frequency plasma, a lithography process 1d which performs exposure for patterning and etching using oxygen plasma, and a cleaning process 1e.

In the assembly line, first in a dicing process, the LSI chips in the wafer are separated one by one, and the LSI chips which were judged to be non-defective in the probe inspection process are packaged in a packaging process 4. In the packaging process 4, the LSI chips are each sealed with resin together with lead pins, or hermetically sealed in a ceramic container, to complete a semiconductor device, or completed as TAB (tape automated bonding) in which electrodes of the LSI chip are connected to lead terminals formed on tape.

The LSI chips now in the form of finished products are aged in an aging process 5. The "aging" means an accelerated aging test in which a predetermined voltage is applied to each semiconductor device, allowing the semiconductor device to operate at a predetermined atmosphere temperature, for a predetermined time, for example a test in which each semiconductor device is operated at 125° C. for 4 to 96 hours. The purpose of aging is for stabilizing the circuit operation of each semiconductor device and distinguishing defective semiconductor devices which are short in service life in the sense of reliability. According to an aging method commonly adopted, each LSI chip is placed into a socket on an aging board provided with required wiring and parts, and electric operations are performed in a constant high temperature vessel. In this aging process, a certain ratio of LSI chips which were even judged to be non-defective in the probe inspection process 2 are judged to be defective by being subjected to temperature stress and electrical stress for a predetermined time. It is presumed that such LSI chips came to have some cause of failure in the wafer fabrication line. Nevertheless, they were not judged to be defective in the probe inspection process, and there appeared failure mode in the aging process. The products found to be defective in the aging process 5 are removed in the next selection process 6, and only non-defective or conforming products are shipped. Thus, aging under appropriate conditions permits the shipment of only products having a sufficient useful life in actual use. In other words, the aging process is an indispensable process in the manufacture of semiconductor devices.

However, the following problems have been encountered in the aging process. Firstly, since the aging process is carried out after the packaging process 4, even defective chips short in life and low in reliability are assembled and thus eventually a wasteful work has been conducted. Secondly, although there is an increasing demand for packaging a semiconductor device in the state of a chip for attaining a high-density packaging, aging in the state of a chip is not performed in the foregoing semiconductor device manufacturing process and so the reliability of the semiconductor device obtained has been uncertain. Particularly, in the case of a product or a unit having plural chips as module, the probability of failure in aging of the product or the unit is high.

In view of the above circumstances, studies have recently been made about wafer aging in which aging is performed in the state of a wafer. However, wafer aging involves the following problems. It is difficult to make stable contact with electrodes on many and fine chips, and for making contact with such electrodes over a wide area of a wafer it is required to consider the flatness and thermal expansion of the wafer. Notwithstanding these problems, a wafer aging method has been proposed in which aging of wafer is performed after the wafer completion process 1 and before the probe inspection process 2. For example, in Japanese Patent Laid Open No. 167343/85, power application pads are formed on a wafer of the same material as that of a test wafer, then this wafer as a screening wafer is pushed against the test wafer, and aging is performed for all the chips on the wafer at a time. In Japanese Patent Laid Open No. 143436/87, electrodes for power supply with current limiting chip resistors connected thereto are provided on a substrate as electrifying jigs for effecting wafer aging. The current limiting chips are for preventing an excessively large current from flowing into shortage failure chips during aging. It has also been proposed to form slits in a substrate and make alignment by registration between the slits and alignment marks or scribing lines on a test wafer. According to a proposal made in Japanese Patent Laid Open No. 293629/87, a lid having a large number of needles capable of expanding and contracting vertically is pushed against a test wafer to obtain a stable contact state between chip electrodes and the needles. Further, in the above three conventional methods it is proposed to sandwich the aging substrate and the test wafer in between two plates, or sandwich the test wafer in between the aging substrate and one plate, to apply pressure, and perform aging in a fixed state.

If a defective product is detected by the wafer aging, it follows that a cause of this failure lies in the wafer fabrication line up to the completion of wafer. Therefore, by locating a failure process by analysis on the basis of such detected failure information, feeding the result of the analysis back to the wafer fabrication line quickly and repairing the failure process, it is possible to prevent further formation of such defective product.

In the above prior art methods, however, no consideration has been given to this point. In other words, no consideration has been made about the feedback to the wafer fabrication line of failure information on the reliability of chips for use in the improvement of the wafer fabrication line.

Moreover, according to the above conventional wafer aging methods, it has been difficult to effect aging for the chips on the whole area of a wafer correctly and efficiently under same and stable conditions. More particularly, the aging method disclosed in Japanese Patent Laid Open No. 143436/87 involves the problem that the aging equipment used is too large because it is required to use a large number of current limiting chip resistors. Next, the aging method disclosed in Japanese Patent Laid Open No. 293629/87 involves the problem that it is difficult to apply this method to the case where the chip electrode pitch on the wafer is narrow, say, 100 $\mu$m or smaller. Further, the aging method disclosed in Japanese Patent Laid Open No. 143436/87 involves the problem that since the electrodes for power supply and the slits are formed separately, it is impossible to attain a high relative positional accuracy of the two and hence it is difficult to make accurate alignment of the power supply electrodes with respect to the electrodes on the whole area of the wafer. As to the operation of each chip during aging, the line voltage is apt to vary due to periodical changes of the supply current or due to the entry of electrical noises from the exterior, thus making it impossible to perform a stable operation, sometimes resulting in destruction of the chip. But means for preventing these inconveniences is not described at all in the above prior art publications, nor is given therein any consideration about aging a large number of wafers at a time and about pushing the power supply electrodes against the whole area of a wafer at a uniform pressure.

According to the foregoing conventional techniques, therefore, it has been impossible to effect the wafer aging correctly and efficiently, collect highly reliable failure information and feed back such failure information quickly to the wafer fabrication line.

SUMMARY OF THE INVENTION

It is the object of the present invention to solve the above-mentioned problems and provide a semiconductor device manufacturing process capable of performing a wafer aging correctly and efficiently, collecting highly reliable failure information, feeding back such failure information quickly to the wafer fabrication line and thereby affording a semiconductor device of high reliability.

For achieving the above object, the semiconductor device manufacturing process of the present invention comprises:

a wafer completion process having plural processes for incorporating predetermined functions into a wafer;

a wafer aging process for aging the wafer fabricated by the wafer completion process;

a probe inspection process for inspecting the predetermined functions of the wafer aged by the wafer aging process and distinguishing between non-defective or conforming chips and defective or non-conforming chips;

a dicing process for separating one by one the chips in the wafer inspected by the probe inspection process;

a selection process for sorting out the chips separated by the dicing process into non-defective and defective chips on the basis of failure information provided from the probe inspection process; and feedback process for analyzing the failure information provided from the probe inspection process and feeding the result of the analysis back to the wafer completion process.

The following description is now provided about the operations and effects of the above processes.

The wafer completion process mainly comprises a thermal oxidation process, an impurity doping process, a thin film formation process, a lithography process, and a cleaning process. Through these processes, functions required for a semiconductor device are incorporated into a wafer. The wafer thus provided with such functions is aged by the wafer aging process and tested for long-period reliability of the said functions. Thereafter, the chips are tested for their functions as semiconductor devices by the probe inspection process, whereby some chips are judged to be defective in point of reliability. Then, in the dicing process, the chips in the wafer are separated one by one. The chips thus separated are sorted out into non-defective and defective chips by the selection process in accordance with the failure information provided from the probe inspection process. In this selection process it is possible to prevent the shipment as products of chips which were judged to be defective in point of long-period reliability. Further, the failure information provided from the probe inspection process is analyzed by the feedback process to judge which process in the wafer completion process causes the failure. Thus, if the wafer completion process is immediately followed by wafer aging and probe inspection, it is possible to remedy the failure process without going through other processes wastefully. Going through the above processes permits the semiconductor device manufacturing process to manufacture semiconductor devices having reliability over a long period without waste and that positively.

Further, by obtaining the aforesaid failure information not only from the probe inspection process but also from the wafer aging process, it is made possible to increase the amount of information on failure, that is, the failure information can be made more accurate.

The analysis made by the feedback process will now be explained in detail. In the analysis of failure information, since the failure information is for each chip present in the wafer, a failure map can be prepared by a failure map making process, whereby it is possible to locate defective chips in the wafer. Therefore, it is possible to check where in the wafer defective chips are concentrated and then locate a failure process by analysis in the analysis process on the basis of such concentrated area of defective chips.

If the failure map making process is executed for each failure mode, a more detailed analysis can be made to locate a failure process because of different failure processes according to failure modes. Even in the same semiconductor manufacturing process, wafers go through different apparatus lot by lot, so by analyzing failure information for each lot it is possible to analyze which apparatus among the apparatus in the same manufacturing process is a failure apparatus.

The method for obtaining correct failure information will now be explained in detail. For obtaining correct failure information it is necessary to perform wafer aging to a satisfactory extent. To this end, the following methods are known.

The wafer aging is conducted by flowing an electric current through chips, but in this case there is the possibility of the line voltage being varied due to periodical changes of the supply current or due to external noises. To prevent this variation, it has been proposed to use a multilayer ceramic chip capacitor for the suppression of noises, whereby a certain stable current can be supplied to the chips. Further, by using a current limiting thick film or a thin-film resistor it is possible to prevent excessive current from flowing through the chips.

The wafer aging is performed by contacting electrodes for power supply with the chips in a wafer. But this contact is sometimes not attained due to strain of the wafer or the difference in height of the power supplying electrodes. In this case, an anisotropic electro-conductive material may be interposed between the chips and the power supplying electrodes, and by utilizing the elasticity of this material it is possible to ensure the contact.

Simultaneously with the formation of the power supplying electrodes it is possible to form alignment marks with high accuracy on a board for power supply, so that the electrodes on a test wafer and the power supplying electrodes can be registered with each other accurately.

By stacking plural wafers and plural power supplying boards alternately and applying a load to all of them at a time, it is possible to impose a uniform load on a large number of wafers in a short time. Thus, wafer aging can be effected under the same conditions, so it is possible to obtain stable failure information.

By putting a wafer and a power supplying board one upon the other in a container having a pressure block and discharging the internal gas of the container, allowing the pressure block to be pressed against the wafer or the power supplying board due to the difference between the atmospheric pressure and the internal pressure of the container, it is possible to apply a uniform pressure to the whole of the wafer and so it is possible to obtain stable failure information.

BRIEF DESCRIPTION OF THE DRAWINGS

FIG. 1 shows a semiconductor device manufacturing process embodying the present invention;

FIG. 9 shows a relation between failure mode and causes of failure in a semiconductor device;

FIG. 10 shows a memory cell equivalent circuit of MOS DRAM;

DESCRIPTION OF PREFERRED EMBODIMENTS

Figure 2A:
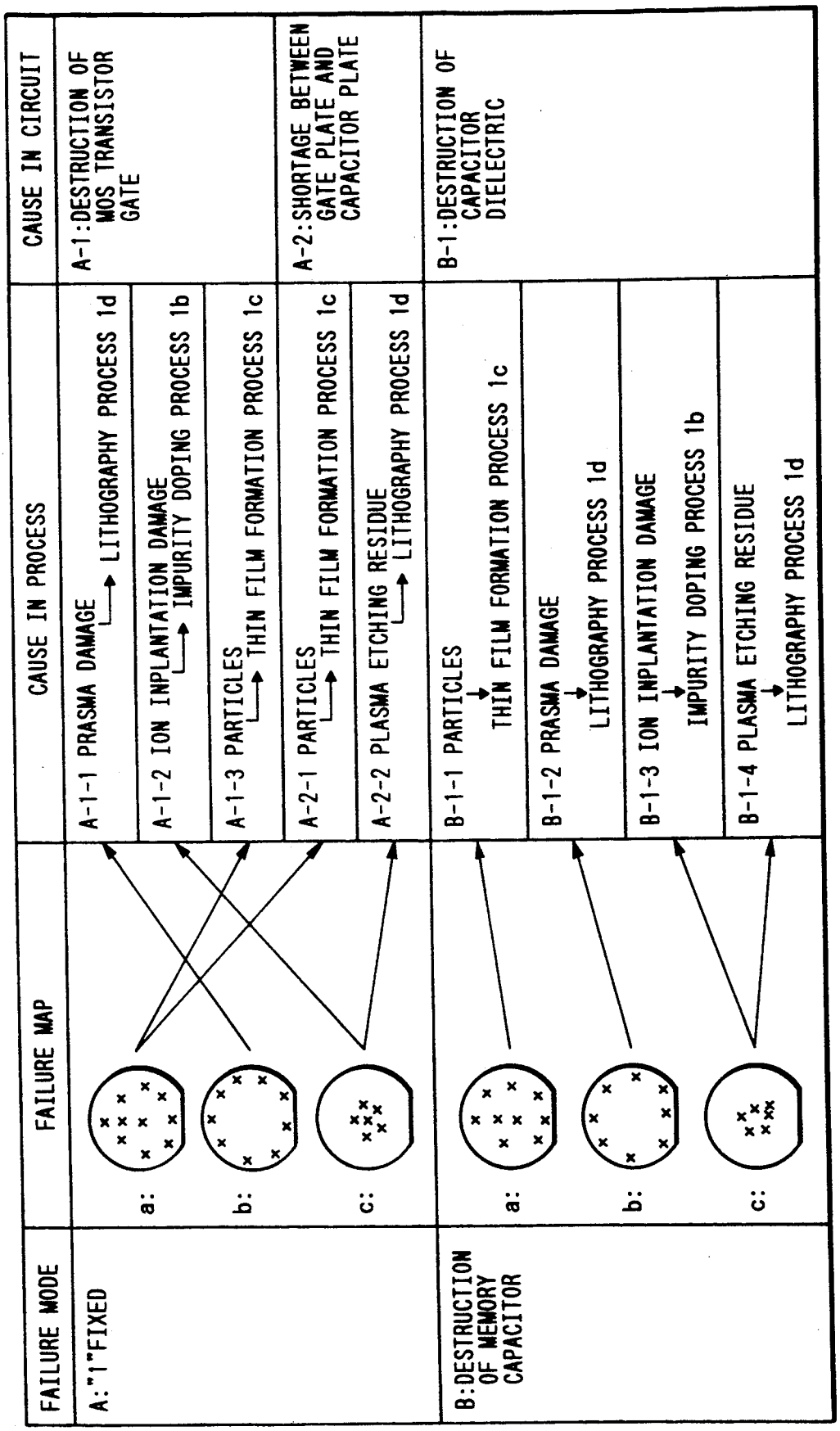
FIG. 2(a) shows failure analysis according to the present invention.

Embodiments of the present invention will be described hereinunder with reference to the accompanying drawings.

FIG. 1 illustrates an LSI manufacturing process including a wafer aging process 105 according to the present invention. The wafer aging process 105 is carried out after a wafer completion process 1, and then in a probe inspection process 2 there is made measurement of electrical characteristics which is an inspection of reliability. These processes belong to a wafer fabrication line. The LSI wafer itself then goes through processes belonging to an assembly line which are a dicing process 3, a packaging process 4 and a selection process 6, and is then shipped as a product.

The wafer aging process 105 is executed for LSI in the state of wafer. During the wafer aging, it is possible to monitor the state of operation and electrical characteristics of each chip, thus permitting failure information to be obtained during aging. For example, in a memory LSI, this can be done by writing "1" or "0" data in a memory cell, thereafter reading out the data written in the memory cell, then making a comparison between the read-out data and the written data, and judging that the product is non-defective if both data are coincident with each other or the product is defective if both data are not coincident with each other.

Next, in the probe inspection process after the wafer aging process, measurement of detailed electrical characteristics is made with respect to each chip on the wafer, also making it possible to obtain information on failure.

The failure information pieces thus obtained are classified into failure modes in accordance with a later-described method. In this connection, it turned out that there was a certain relation between each failure mode and a cause thereof (cause in process). The said certain relation will be explained below with reference to FIGS. 9 and 10.

FIGS. 9 and 10 explain the relation between failure modes of a semiconductor device and causes thereof in process with respect to MOS DRAM (Metal-Oxide-Semiconductor Dynamic Random Access Memory). Writing and reading of data "1" or "0" to and from MOS DRAM are performed under various operation conditions, and classification is made into some failure modes according to failure conditions. Main causes thereof are as shown in FIG. 9. FIG. 10 illustrates an equivalent circuit of a single memory cell of a MOS DRAM LSI. In FIG. 9, a failure mode A is a mode in which even if "1" or "0" is written in the memory cell, indicated at 100, the read data is always fixed to "1". Main causes in circuit of this failure mode are presumed to be destruction of the gate insulating film of a MOS transistor 101 (A-1) and shortage between a gate electrode 102 of the MOS transistor and a memory capacitor electrode 104 of a memory capacitor 103 (A-2). Further, the following are presumed to be caused in process corresponding to the above causes in circuit.

(A-1)

A-1-1 Plasma Damage

In a lithography process 1d using oxygen plasma, various ions impinge upon the gate insulating film and destroy the film.

A-1-2 Ion Implantation Damage

In an impurity doping process 1b, an electric charge is accumulated on the wafer surface to create a high electric field, which destroys the gate insulating film.

A-1-3 Particles

The presence of particles in a thin film formation process 1c would prevent the formation of a gate insulating film and destroy the same film.

(A-2)

A-2-1 Particles

The presence of particles in the thin film formation process would cause etching residue of pattern, with the result that the gate electrode 102 of the MOS transistor and the capacitor electrode 104 of the memory capacitor 103 approach each other, thus leading to deterioration in insulating property of the two.

A-2-2 Plasma Etching Residue

In the event of etching residue of pattern in the lithography process 1d using plasma, the gate electrode 102 of the MOS transistor and the capacitor electrode 104 of the memory capacitor 103 approach each other, thus causing deterioration in insulating property of the two.

Thus, the above five causes are mentioned as only main causes in process relating to the failure mode A. In the aging process 5 which follows the packaging process 4 in the prior art, there is obtained only failure information on each packaged chip, considerable labor and time are required for the estimation, research and improvement of a failure process.

Now a failure mode B will be explained. This failure mode is caused by destruction of the memory capacitor 103 which stores memory information. With increase or decrease in voltage of the memory capacitor electrode 104 in FIG. 10, the leak current flowing in the dielectric of the memory capacitor 103 also increases or decreases. But in this failure mode, when the value of the above voltage is a rated value, the said leak current flows in a larger amount than the rated value. The cause in process thereof is the destruction of the dielectric of the memory capacitor 103, e.g. SiO$_2$ film, (B-1). More particularly, the following are presumed to be causes in process.

(B-1)

B-1-1 Particles

The presence of particles in the thin film formation process 1c would prevent the formation of SiO$_2$ film and destroy the same film.

B-1-2 Plasma Damage

In the lithography process 1d using oxygen plasma, various ions impinge upon SiO$_2$ film and destroy the film.

B-1-3 Ion Implantation Damage

In the impurity doping process 1b, an electric charge is accumulated on the wafer surface to create a high electric field, which destroys the SiO$_2$ film.

Improvement in process of the failure mode B cannot be done efficiently by the prior art, like the failure mode A. But in the present invention, since aging is performed in the state of wafer, it is possible to obtain a failure pattern on the wafer, and by analyzing it, it is possible to make estimation, research and improvement of a failure process. The present invention will be described in more detail below.

Figure 14A:
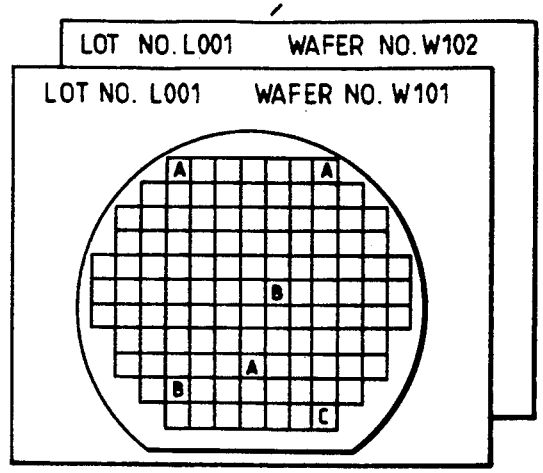
Figure 14B:
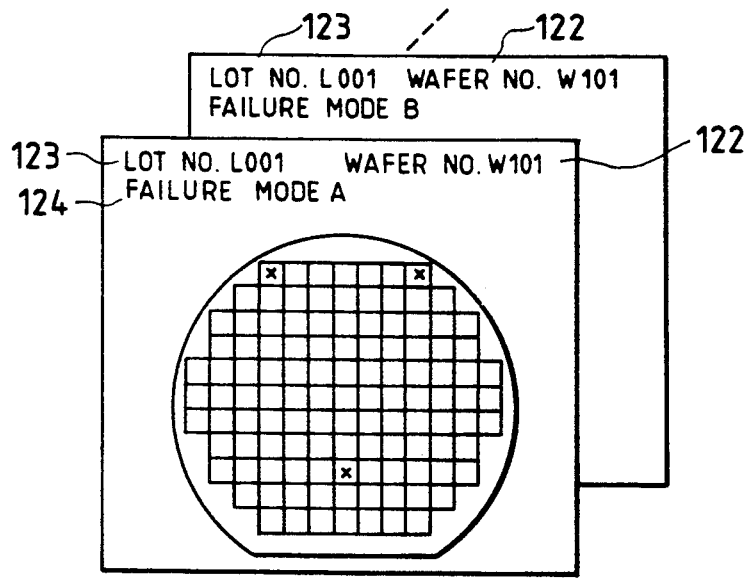
Figure 14C:
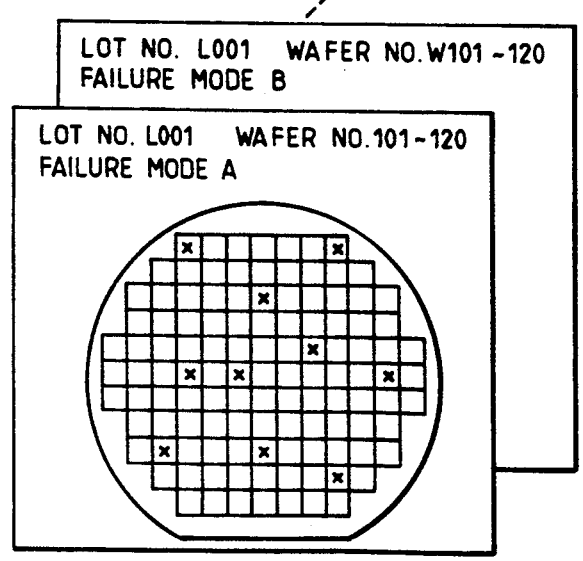

For analyzing failure information on the basis of failure pattern there is formed by a failure map making process 106 a failure map showing in which positions of each wafer failure modes (A and B in this embodiment) are present in accordance with the failure information on each chip obtained above. The failure information obtained in the wafer aging process 105 or the probe inspection process 2 is expressed on the failure map in the following manner. With respect to the failure information, as shown in FIG. 14(a), failure modes A and B of each chip in each wafer are clarified. In the same figure, the symbol-free chips represent non-defective chips, and each wafer is made clear its wafer number 122 Wijk (i, j, k=0, 1, 2, 3, . . . ) and production lot number 123 LOOi (i=1, 2, 3, . . . ) to which it belongs in the wafer fabrication line. Next, for each wafer and for each failure mode 124, the "x" mark is put on the position of each defective chip to prepare a failure map, as shown in FIG. 14(b). This failure map is analyzed for failure distribution as will be described later, then out of plural processes, a failure process is specified, or limitation is made to several processes, and this information can be fed back to the wafer fabrication line. As shown in FIG. 14(c), moreover, if failure maps of plural wafers belonging to the same lot are collected for each failure mode into a single failure map, it is possible to obtain a failure map in the unit of lot, whereby a failure process can be specified or limitation can be made to several processes for each lot, and this information can be fed back to the wafer fabrication line.

The following description is now provided about a method for analyzing a failure map in an analysis process 107 and specifying a failure process or limiting to several processes.

Figure 15:
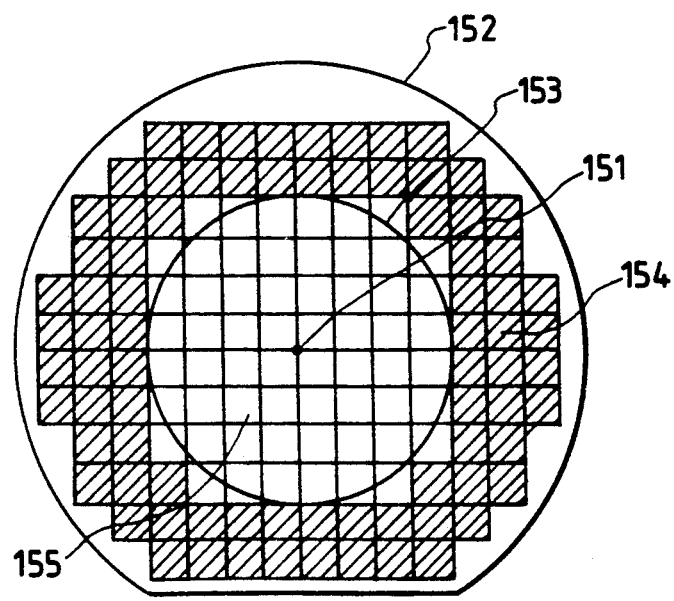
FIG. 15 shows the definition of patterns in the failure map.

First, the definition of patterns in a failure map will be explained with reference to FIG. 15. A concentric circle 153 having a center coincident with a center 151 of an outer circle 152 of the wafer and having a radius which is a half of that of the outer circle 152 is supposed. Chips (indicated by oblique lines) each belonging in the whole area to the area between the outer circle 152 and the concentric circle 153 are defined to be outer chips 154, while the other chips than the outer chips 154 are defined to be central chips 155. With respect to a specific failure mode, if the number of chips involving the said failure mode is N, the number of such chips belonging to the outer chips 154 is $N_o$, and the number of such chips belonging to the central chips 155 is $N_i$, then $P_o$ and $P_i$ are defined as follows:

$P_o = N_o/N$ $P_i = N_i/N$

Pattern a is a pattern corresponding to neither of later-described patterns b and c. In pattern a, failure occurs in random positions in a wafer. Pattern b corresponds to the case where $P_o \geqq 0.8$ for example, in which failure occurs in the peripheral portion of the wafer. Pattern c corresponds to the case where $P_i \geqq 0.8$ for example, in which failure occurs in the central portion of the wafer.

Figures 11, 12:
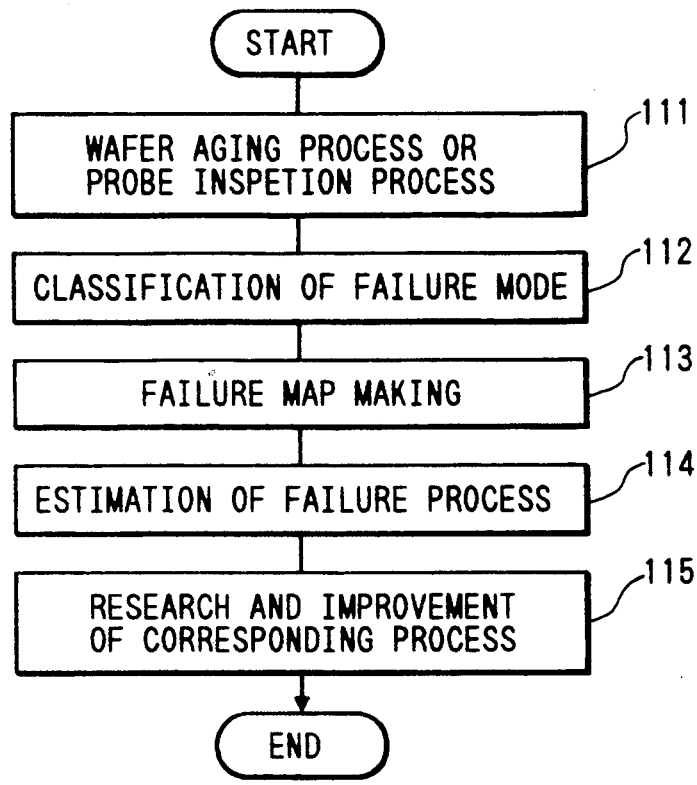
FIG. 11 shows the details of a feedback process used in the present invention.
FIG. 12 shows failure mode classifying information.

The analysis process will now be explained with reference to FIG. 11. In the aging process 105 carried out in the state of wafer or in the subsequent probe inspection process 2, whether each chip on the wafer is nondefective or defective is made clear, and with respect to each of defective chips, a failure mode is made clear on the basis of its electrical characteristics. Next, classification of failure modes (112) is executed in the manner illustrated in FIG. 12 for example. More specifically, classification of failure modes is made according to coordinates of each defective chip position (121) in each wafer, wafer No. (122) to which that chip belongs, lot No. (123) to which that wafer belongs, and failure mode (124). In connection with the lot No. (123), the year, month and date corresponding to the introduction into each process in the wafer fabrication line, equipment identification number, and the name of each worker, are separately prepared beforehand. Then, failure map making (113) is performed in the foregoing manner on the basis of the above information on the classification of failure modes. Next, using the failure map thus formed, a later-described estimation of failure process (114) is made, followed by research and improvement (115) of the corresponding process.

Figure 13:
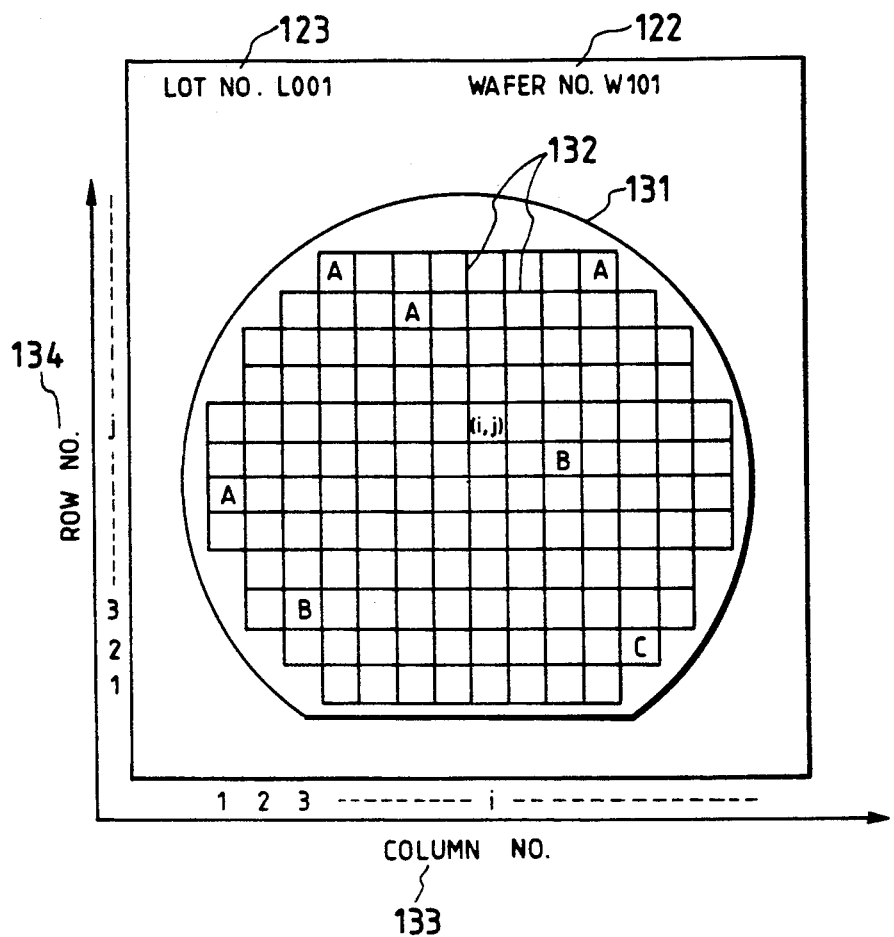
FIGS. 13, 14(a), 14(b) and 14(c) show how to make a failure map.

How to effect the above failure map making (113) will be explained below in detail with reference to FIG. 13. In this embodiment, the failure map formed is displayed on the display of a computer.

First, lot No. (123) and wafer No. (122) are displayed. Next, a profile line 131 of wafer is drawn and chip boundary lines 132 are drawn inside the wafer profile line 131. Coordinates of chip position are defined by the combination (i, j) of column No. (133) (i) and row No. (134)(j), as illustrated in FIG. 13. Then, in accordance with the information on the classification of failure modes shown in FIG. 12, symbols A, B, C, ... corresponding to the failure modes are displayed in the positions on the display corresponding to the coordinates of the same failure chip positions. This operation is performed by a number of times corresponding to the number of wafers to be analyzed, as shown in FIG. 14(a).

Then, as shown in FIG. 14(b), only the data of a specific failure mode is selected from the above data, and lot N.. (123), wafer No. (122) and the failure mode (124) are displayed. Then, in the same manner as in the above operation, "x" marks are put on the positions of the failure chips to form a failure map on only one failure mode. On the basis of the information of this failure map, a cause of the failure can be specified or restriction can be made to possible causes, then this information can be fed back to the wafer fabrication line. Further, by collecting such map information pieces on the same failure mode to obtain a collective failure map information, it becomes possible to estimate a more detailed failure cause as will be described later.

If the distribution state of failure mode A (fixed to "1") occurs in pattern a (random positions), as shown in FIG. 2(a), it is presumed that in the thin film formation process 1c polycrystalline silicon adhered to the inner walls of the thin film forming equipment fell off onto the wafer as particles and could not be removed even in the subsequent etching process (not shown) for the formation of pattern. Thus, from A-1-3 (Particles) and A-2-1 (Particles) it can be analyzed that the cause in process resides in the thin film formation process 1c.

If the distribution state of failure mode A occurs in pattern b (concentration on the wafer peripheral portion), it can be analyzed from A-1-1 (Plasma Damaga) that the cause in process resides in the lithography process 1d. This is because in a plasma process (not shown) used in the lithography process 1d, the field intensity in the wafer peripheral portion becomes high and the impingement energy of various ions upon wafer is increased, so failure occurs concentratively on the wafer peripheral portion.

If the distribution state of failure mode A occurs in pattern c (concentration on the wafer central portion), it can be analyzed that the cause in process resides in one or both of the impurity doping process 1b from A-1-2 (Ion Implantation Damage) and the lithography process 1d from A-2-2 (Plasma Etching Residue). This is because in an ion implantation process (not shown), the electric charge is more difficult to escape and easier to be accumulated at the wafer central portion, so deterioration of the insulating film for example is apt to occur. Also because in a plasma etching process (not shown) the plasma density is lower at the central portion than at the wafer peripheral portion, so the etching speed becomes lower and there occurs plasma etching residue at the central portion.

Also as to the failure mode B it is possible to make the same analysis. By making analysis for each of the failure modes (A and B), even with respect to the same cause in process, it is possible to analyze which process is a failure process and which functional component (e.g. gate insulating film, memory capacitor) was produced in connection with the failure process. According to the ordinary wafer fabrication process, a wafer goes through the same process several times for incorporating predetermined functions therein. By analyzing which function caused failure when incorporated in the wafer, it is possible to make restriction to that function incorporating process in the said same process and then make repair, etc.

Figure 2B:
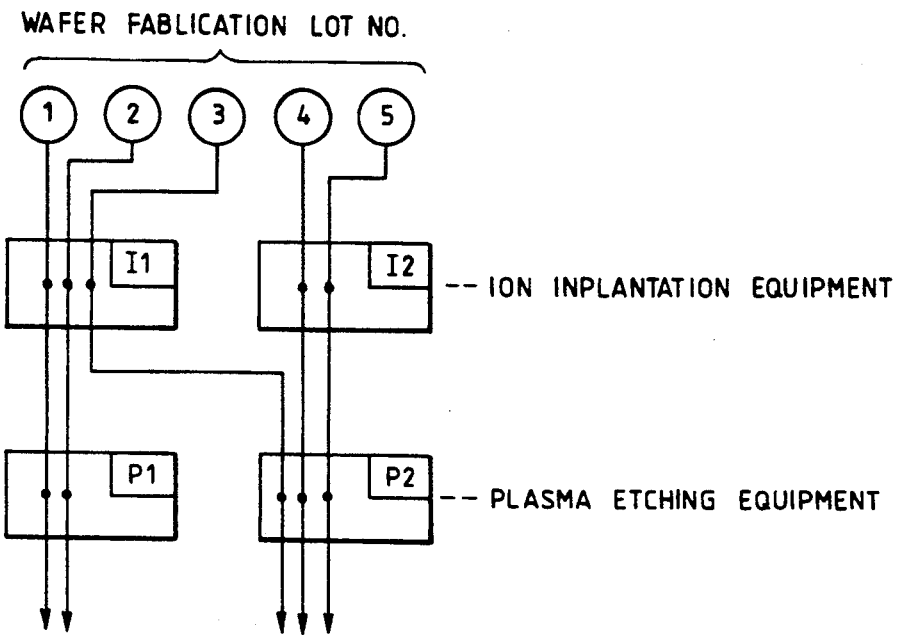
FIG. 2(b) shows an example of a semiconductor device manufacturing process lot by lot.

The following description is now provided about the effect of collecting failure map information pieces for each lot number in the wafer fabrication line. In the foregoing explanation of FIG. 2 it was mentioned that when the failure mode is A (fixed to "1") and the failure map corresponds to pattern c, it is possible to restrict causes in process of the failure to two which are A-1-2: Ion Implantation Damage and A-2-2: Plasma Etching Residue. At this time, in addition to the above information, an information is assumed to have been obtained as lot number information in the wafer fabrication line, indicating that the above pattern c failure occurred in only the first and second lots out of the first to the fifth lots, with no failure in the third to the fifth lots. And it is here assumed that the relation illustrated in FIG. 2(b) was obtained as a result of having checked the relation to the above lot numbers with respect to the ion implantation equipment and the plasma etching equipment in the wafer fabrication line. More particularly, if it is only a plasma etching equipment Pl that only the first and second lots have passed through out of the first to the fifth lots, it is presumed that the above failure is caused most probably by some trouble of the plasma etching equipment P1. And it is possible to start research immediately.

According to this embodiment described above, since semiconductor devices are aged in the state of wafer and a failure map for each failure mode obtained in the subsequent measurement of characteristics is fed back to the wafer fabrication line, it is possible to clarify the cause of reliability failure in the wafer fabrication line and take a countermeasure quickly.

Figure 3:
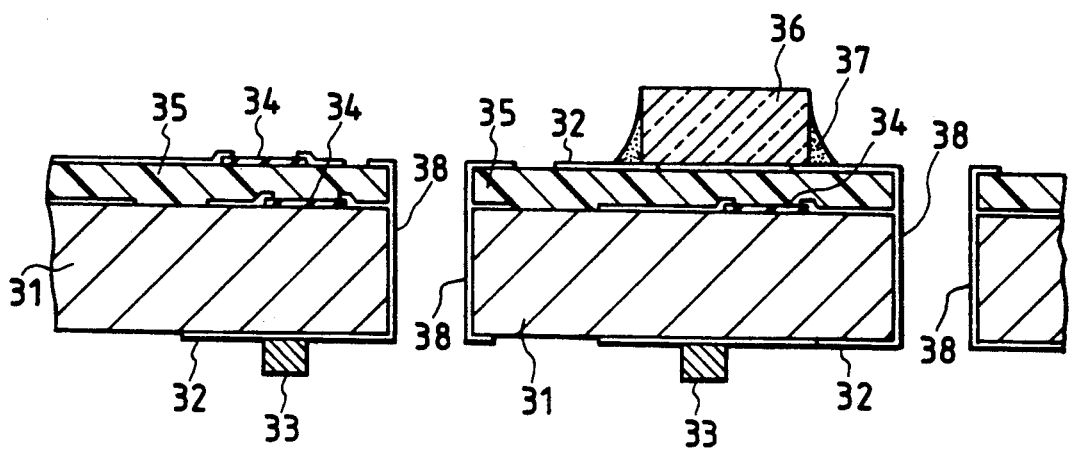
FIG. 3 shows a section of a power supply board according to the present invention.

Referring now to FIG. 3, there is illustrated the section of a power supply board for wafer aging which is used for carrying out the wafer aging process 105 in a highly accurate manner. A base 31 of the power supply board is made of a material same as or closely similar to the material of the semiconductor wafer in point of thermal expansion coefficient, e.g. cordierite ceramics ($2Al_2O_3.2MgO.5SiO_2$) or Sic ceramics. On the base 31 there is formed wiring 32 by photo etching of copper foil, printing and baking of conductor paste, photo-etching of a metal deposited thin film, or plating. On part of the wiring 32 there are formed electrodes 33 for power supply in the form of lugs by photo-etching and plating. In the case where the chip electrodes themselves of the semiconductor wafer are in the form of lugs, e.g. chip electrodes for TAB, part of the wiring 32 may be used as the power supplying electrodes 33. To the electrodes 33 are connected current limiting, thick or thin film resistors 34. In this case, a thick resistor film is formed by printing a resistor paste followed by baking, while a thin resistor film is formed by vapor deposition of Ni-Cr alloy followed by photo-etching to form pattern. If necessary, in order to reduce the formation area of the current limiting thick or thin film resistors 34, the resistors 34 may be formed multilayerwise through an inter-layer insulating film 35. Further, if the power supplying electrodes 33 are power source electrodes, a multilayer ceramic chip capacitor 36 is mounted using solder 37 between the power source electrodes and the ground electrode for the suppression of noise. The layer wirings are connected together by through-hole plating 38. Thus, by using thick or thin film resistors as current limiting resistors which film permits a multi-layer structure and by using as a noise suppressing capacitor the multilayer ceramic chip capacitor 36 having a small packaging area, it is possible to realize a wafer aging power supply board of a small area.

Besides, since the power supply board is made of a material whose thermal expansion coefficient is equal to or extremely close to that of wafer, displacement is difficult to occur between the power supply board and the wafer under heating for aging, and since noise is suppressed by the multilayer ceramic chip capacitor 36, the wafer can be aged accurately and it is possible to obtain an exact failure mode. Consequently, it is possible to analyze a failure process accurately.

Figure 4A:
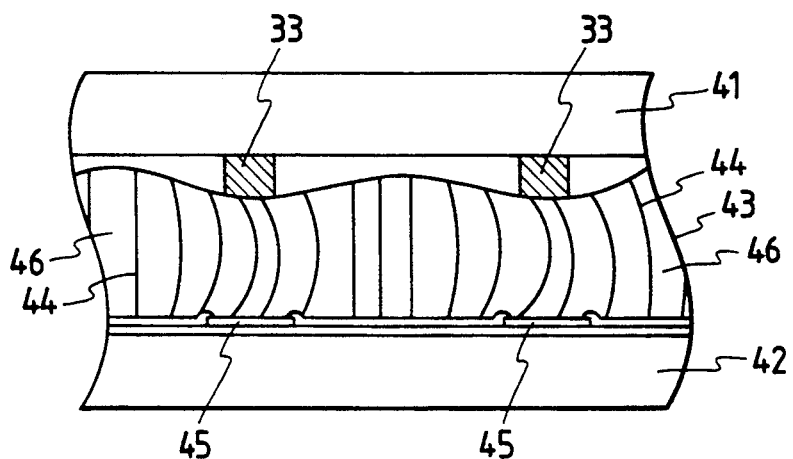
FIGS. 4(a) and 4(b) show methods for electrical connection between power supplying electrodes and wafer electrodes according to the present invention.

Now, the method for ensuring electrical connection between the power supplying electrodes 33 of the power supply board and the electrodes 34 of the semiconductor wafer will be described with reference to FIGS. 4(a) and 4(b). As to the power supply board, indicated at 41, was explained above in connection with FIG. 3, so the details thereof will be omitted here. The power supply board 41 having the power supplying electrodes 33 and a semiconductor wafer 42 having a large number of LSI chips are connected, after alignment, electrically with each other through an anisotropic electroconductive material 43 having elasticity.

The anisotropic electroconductive material 43 is generally in the form of tape or sheet and has the property that it is conductive selectively only in a mutually pressure-contacted direction and not conductive with the adjacent areas. FIG. 4(a) shows the case where an electroconductive substance in the anisotropic electroconductive material 43 comprises fine wires 44. Planar relative positions of a large number of power supplying electrodes 33 are made coincident with planar relative positions of aluminum electrodes 45 of the semiconductor wafer 42. The electrodes 33 and 45 can be opposed to each other by alignment. The anisotropic electroconductive material 43 basically comprises an organic material having elasticity, which is silicone rubber 46 in this embodiment. The fine wires 44, formed of tungsten or Fe-Ni alloy for example, are disposed a large number through the thickness direction of the silicone rubber 46 planarly at appropriate intervals. By sandwiching the anisotropic electroconductive material 43 in between the power supplying electrodes 33 and the aluminum electrodes 45 and then pressing the power supply board 41 and the semiconductor wafer 42 toward each other, the fine wires 44 are deformed as buckling to make electrical connection between the electrodes 33 and 45.

Figure 4B:
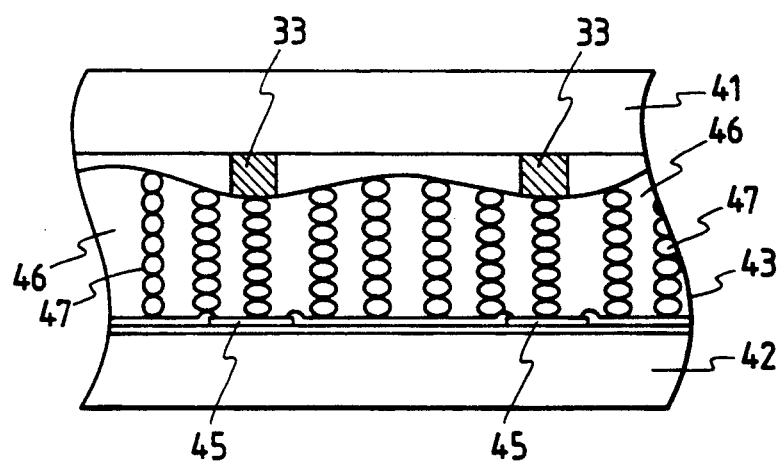

FIG. 4(b) shows an example of using another anisotropic electroconductive material 43. The anisotropic electroconductive material 43 in this example comprises the silicon rubber 46 and electroconductive grains 47 disposed continuously in the thickness direction of the silicone rubber, the electroconductive grains 47 comprising, for example, nickel grains having gold-plated surfaces. By pressing the power supply board 41 and the semiconductor wafer 42 toward each other, the electroconductive grains 47 are compressed in a continuous row in the thickness direction of the silicon rubber 46, whereby the power supplying electrodes 33 and the aluminum electrodes 45 are connected together electrically.

Thus, using the power supplying electrodes of a narrow pitch formed by a photo-etching method and the anisotropic electroconductive material having elasticity is advantageous in that when the power supplying electrodes 33 or the electrodes of the semiconductor wafer are in the form of lugs, it is possible to absorb variations in height thereof and also absorb warps as well as concaves and convexes of the power supply board 41 and the wafer 42, whereby throughout the whole area of the semiconductor wafer 42 there can be attained a stable electrical connection between the power supplying electrodes 33 of a narrow pitch and the electrodes of the wafer 42. Moreover, when the power supply board 41 is used repeatedly for wafer aging, the wear thereof can be greatly reduced. Consequently, the electrical connection between the power supplying electrodes and the wafer electrodes is ensured, so it is possible to obtain accurate information of failure mode and wafer map, and the results obtained can be surely fed back to the failure process.

Figure 5A:
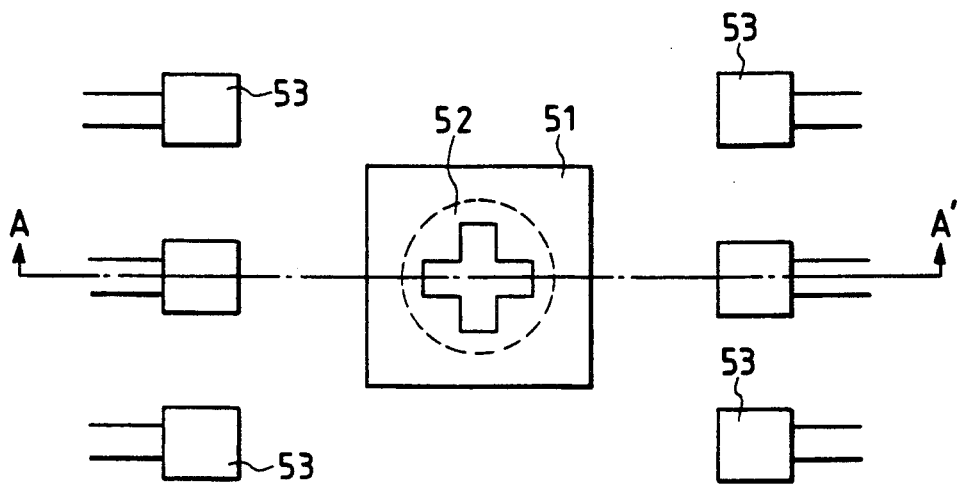
FIGS. 5(a) and 5(b) are a plan view and a sectional view, respectively, of an alignment mark on a wafer aging equipment side according to the present invention.
Figure 5B:
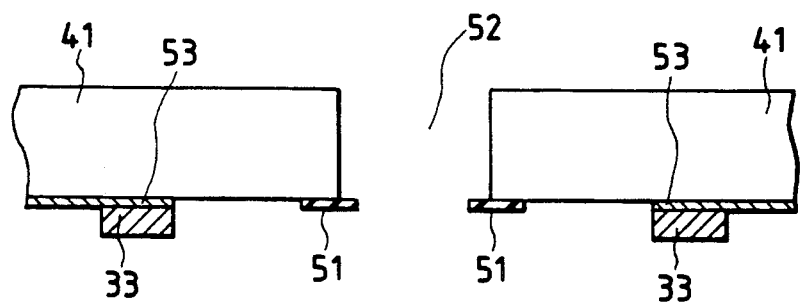
Figure 5C:
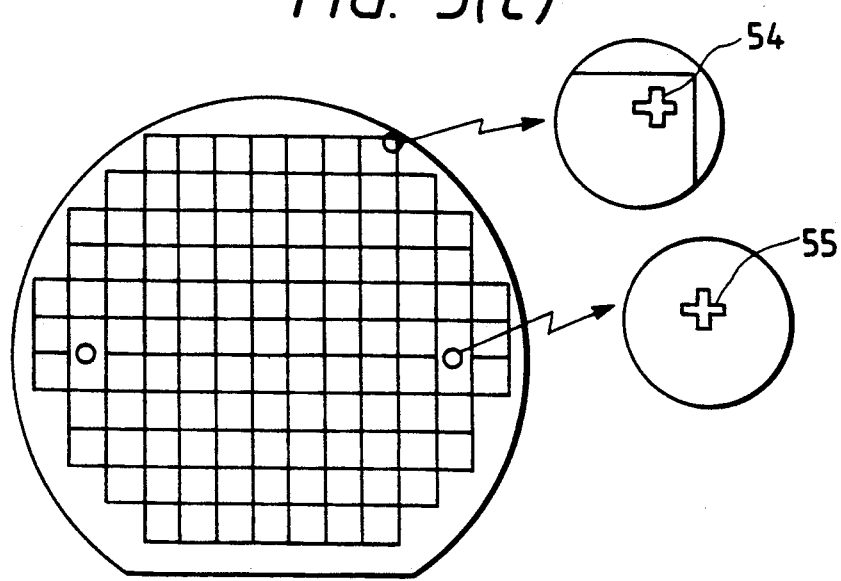
FIG. 5(c), 5(c)', and 5(c") are plan view of wafer alignment marks according to the present invention.

Now, how to make accurate alignment between the power supply board 41 and the semiconductor wafer will be explained with reference to FIGS. 5(a) and 5(b). FIG. 5(a) illustrates an alignment mark 51 on the power supply board 41 and the surroundings thereof. FIG. 5(b) is a sectional view taken on line A—A' of FIG. 5(a). On the power supply board 41 there is formed a through hole 52 for alignment. Copper foil is stuck on the same face, namely the underside in FIG. 5(b), of the power supply board 41, then electrode patterns 53 for forming the power supplying electrodes 33 and the alignment mark 51 on the board are formed in the same process by photo-etching. The alignment mark 52 on the board is formed so as to be positioned within the through hole 52 for alignment so that when seen from above, it can be recognized. The alignment mark 51 on the board shown in FIG. 5(a) has been formed by removing the central part of a square copper foil crosswise by photo-etching. But the shape of the alignment mark 51 is not limited thereto. Under this structure, the on-board alignment mark 51 and a mark obtained by photo-etching of aluminum film for example can be registered with each other. A more detailed explanation: will now be made with reference to FIGS. 5(c), 5(c)' and 5((c)". These figures illustrate an on-chip alignment mark 54 for mask-chip alignment at the time of exposure of the photoresist film in the unit of each chip in the wafer fabrication line, and an on-wafer alignment mark 55 (for mask-wafer alignment) when exposure of the photoresist film is performed throughout the wafer. In the above structure, since the electrode patterns 53 and the on-board alignment mark 51 are formed in the same photo-etching process, there can be obtained a high relative positional accuracy of the two. Therefore, the power supplying electrodes 33 on the power supply board 41 and the electrodes on the semiconductor wafer can be registered with each other with a high accuracy. Consequently, it is possible to obtain accurate information of failure mode and wafer map, and the results obtained can be surely fed back to a failure process.

Figure 6:
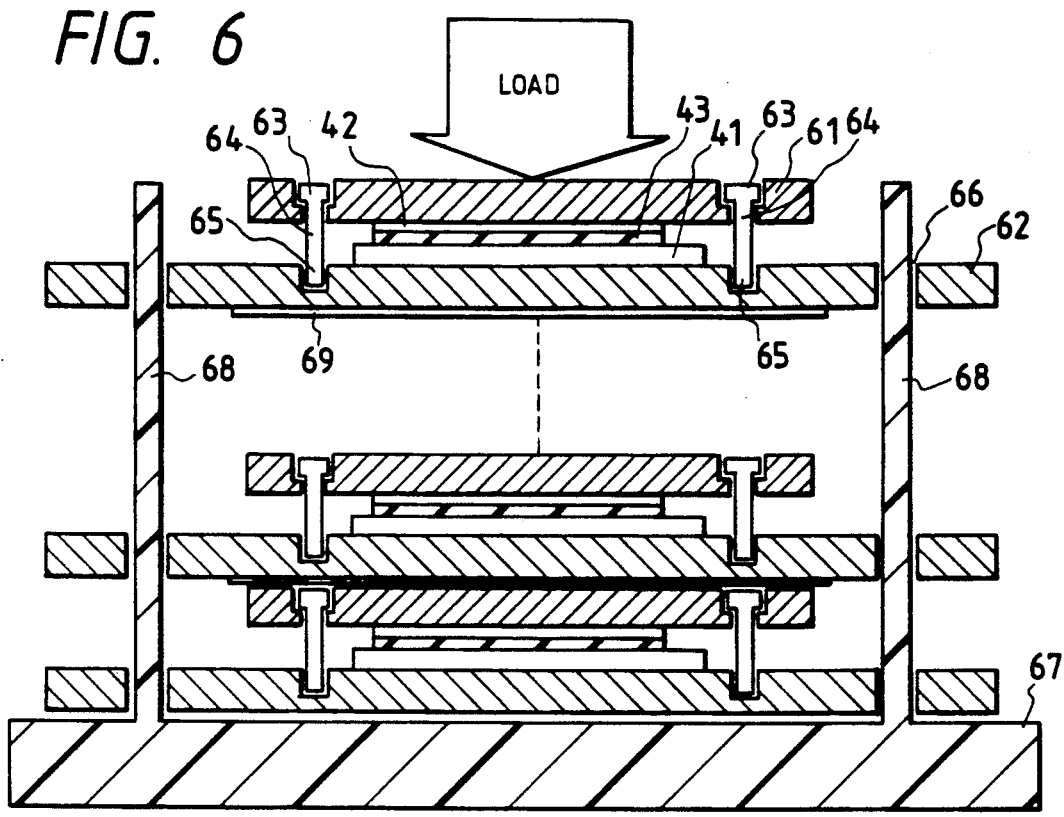
FIG. 6 shows a section of a wafer aging equipment according to the present invention.

Now, an explanation will be made about a wafer aging process with reference to FIG. 6 which process permits a large number of wafers to be aged simultaneously under the same conditions and under the same load imposed on the wafers. The power supply board 41 and the semiconductor wafer 42 are registered with each other with the anisotropic electroconductive material 43 having elasticity interposed therebetween, and in this state they are fixed temporarily by an upper support plate 61 and a lower support plate 62. This temporary fixing is effected, for example, by inserting bolts 63 into temporary fixing holes 64 formed in the upper support plate 61 and temporary fixing threaded holes 65 formed in the lower support plate 62. Then, plural sets each having the above construction are stacked vertically so that guide holes 66 formed in the lower support plate 62 of each set are fitted on guide bars 68 erected on a support base 67, and a load is applied to the upper surface of the top set. At this time, it is desirable to insert a rubber sheet 69 between vertically adjacent sets for the purpose of preventing local concentration of the load due to warps or concaves and convexes of the upper and lower support plates 61, 62. Under this construction, between the power supply board 41 and the semiconductor wafer 42 of each set is applied the same load at the same time using a single load applying means, e.g. pressing means, whereby a large number of wafers can be aged under the same conditions (same load) and thus aging can be realized at a high space efficiency. Besides, since a large number of wafers are aged simultaneously under the same conditions, a large amount of failure information can be obtained in a short time, and hence it is possible to make an accurate analysis of a failure process in a short time. The main point of the present invention resides in a wafer aging equipment in which a single load is applied to a stack of plural sets of structures each comprising at least the foregoing power supply board and semiconductor wafer. The present invention is not limited to the concrete means described in the above embodiment.

Figure 7:
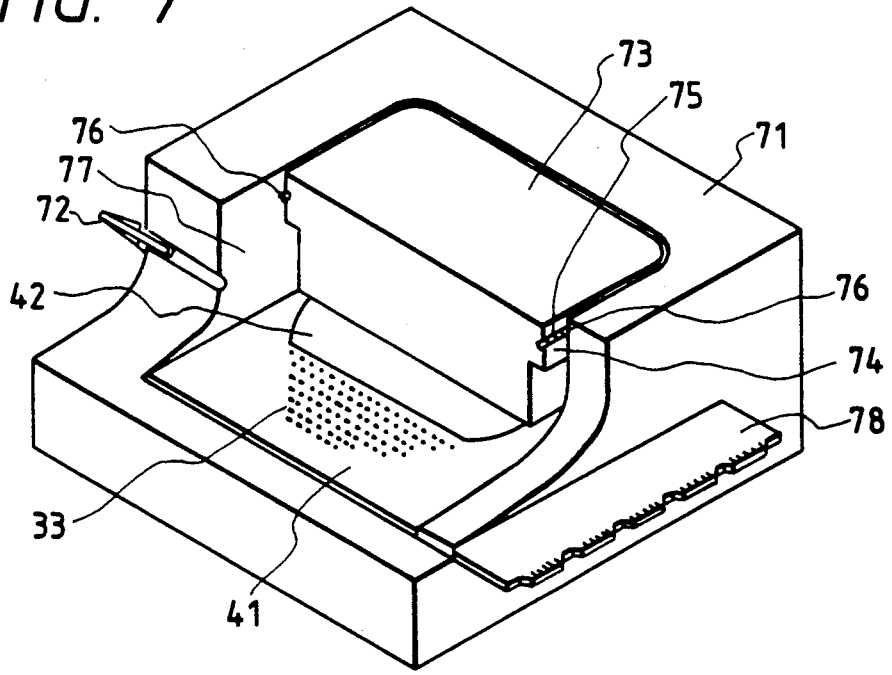
FIG. 7 also shows a section of a wafer aging equipment according to the present invention.
Figure 8:
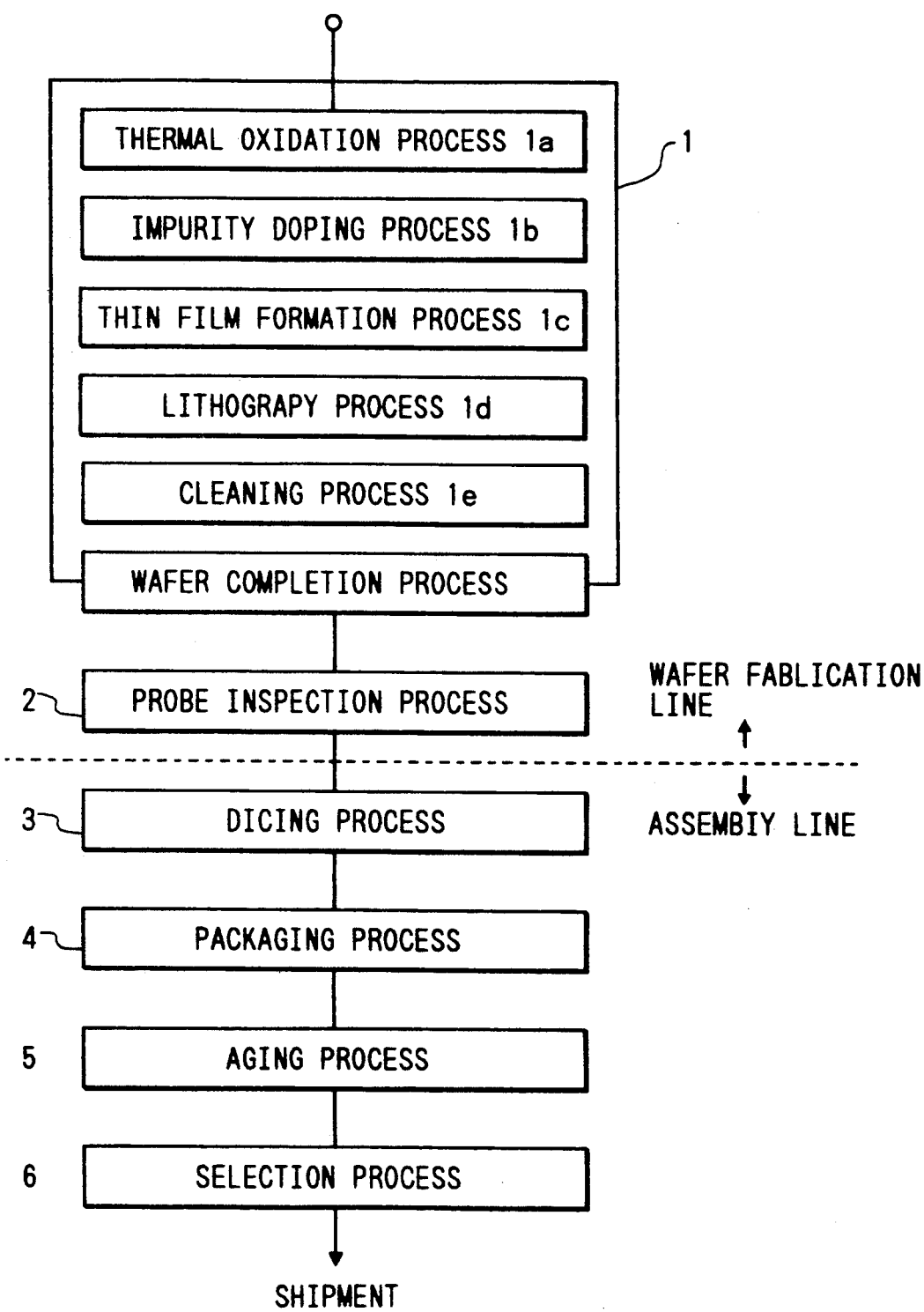
FIG. 8 shows a conventional semiconductor device manufacturing process.

Now, the method for carrying out the wafer aging process accurately by means of a pressurizing equipment will be described with reference to FIG. 7. A vacuum container 71 has a structure which permits the discharge of air from an exhaust port. On a flat inside bottom of the vacuum container 71 is placed the power supply board 41 having the power supplying electrodes 33, and the semiconductor wafer 42 is put on the power supply board 41 while registration is made. Then, over the two is mounted a pressure block 73. In an outer peripheral wall 74 of the pressure block 73 is formed a groove 75 extending around the same wall, and an O-ring 76 made of rubber is fitted in the groove 75. The shape of the O-ring 76 is designed so that when compressed it comes into contact with an inner wall 77 of the vacuum container 71. In this construction, when the internal air of the vacuum container 71 is discharged from the exhaust port 72, the internal pressure is reduced, and due to the difference thereof from the external atmospheric pressure the pressure block 73 acts to press the semiconductor wafer 42 against the power supply board 41. In this way the power supplying electrodes 33 on the power supply board 41 and the electrodes of the wafer 42 are electrically connected together, so that power and signal voltage are supplied from an external electrode portion 78 to perform aging.

The above construction permits a differential pressure between the atmospheric pressure and the internal pressure of the vacuum container to be applied uniformly onto the upper surface of the pressure block, so that the wafer 42 is pressed against the power supply board at a uniform pressure throughout the whole area of the wafer.

Therefore, it is possible to obtain accurate information failure mode and wafer map, and the results obtained can be surely fed back to a failure precess.

What is claimed is:

1. A method for manufacturing a semiconductor device, including:
 a wafer completion process comprising a plurality of processing steps for incorporating functions in a wafer, the wafer having a plurality of chips;
 a wafer aging process for aging the wafer fabricated by said wafer completion process;
 a probe inspection process for inspecting the functions of the wafer aged by said wafer aging process and distinguishing between non-defective and defective chips;
 a dicing process for separating one by one the plurality of chips in the wafer inspected by said probe inspection process;
 a selection process for sorting out the chips separated by said dicing process into non-defective and defective chips in accordance with a failure information provided from said probe inspection process; and
 a feedback process for analyzing the failure information provided from said probe inspection process, estimating a cause of failure and feeding back the result of the estimation of the cause of failure to said wafer completion process, wherein said feedback process includes a failure map making process for making a failure map in accordance with said failure information, and an analysis process for analyzing which processing steps in said wafer completion process causes a failure, on the basis of said failure map.

2. A method for manufacturing a semiconductor device according to claim 1, wherein said failure map making process is carried out for each failure mode.

3. A method for manufacturing a semiconductor device according to claim 1, wherein a plurality of wafers are formed in a production lot, and said failure map making process is carried out for each production lot.

4. A method for manufacturing a semiconductor device according to claim 1, wherein said analysis process analyzes a pattern of the failure map made by said failure map making process.

5. A method for manufacturing a semiconductor device according to claim 1, wherein in said wafer aging process a power source voltage and a signal voltage are supplied from power supplying electrodes for operating the chips in said wafer while suppressing noises using a noise suppressing multilayer ceramic chip capacitor.

6. A method for manufacturing a semiconductor device according to claim 5, wherein in said wafer aging process an electric current flowing through said power supplying electrodes is limited by a current limiting, thick or thin film resistor.

7. A method for manufacturing a semiconductor device according to claim 1, wherein in said wafer aging process, power supplying electrodes and an anisotropic electroconductive material are connected together electrically, and said anisotropic electroconductive material and the chips in said wafer are also connected together electrically, said anisotropic electroconductive material being interposed between the chips and the power supplying electrodes.

8. A method for manufacturing a semiconductor device according to claim 1, wherein in said wafer aging process, power supplying electrodes on a power supply board, and said chips of the wafer, are registered with each other, by the registration of (1) an alignment mark exposed through a hole in the power supply board and formed simultaneously with the power supplying electrodes on the power supply board having a plurality of said power supplying electrodes, with (2) an alignment mark formed on said wafer in said wafer completion process.

9. A method for manufacturing a semiconductor device according to claim 1, wherein in said wafer aging process, a plurality of said wafers and a plurality of power supply boards are stacked alternately, and a load is applied to all of said wafers and said power supply boards at a same time.

10. A method for manufacturing a semiconductor device according to claim 9, wherein said load is applied to the plurality of said wafers and the plurality of power supply boards while the plurality of wafers and the plurality of power supply boards are stacked alternatively, the load being applied in a direction in which the plurality of said wafers and the plurality of power supply boards are stacked alternatively.

11. A method for manufacturing a semiconductor device according to claim 1, wherein in said wafer aging process, said wafer and a power supply board are put one upon the other in a container having a pressure block, then the internal gas of said container is discharged, and due to a pressure difference between the atmospheric pressure and the internal pressure of said container, said pressure block is pressed against said wafer or said power supply board to make electrical conduction between the chips in said wafer and power supplying electrodes of said power supply board.

12. A method for manufacturing a semiconductor device, including:
a wafer completion process comprising a plurality of processing steps for incorporating functions in a wafer, the wafer having a plurality of chips;
a wafer aging process for aging the wafer fabricated by said wafer completion process, inspecting the functions of the wafer and distinguishing between non-defective and defective chips;
a probe inspection process for inspecting the functions of the wafer aged by said wafer aging process and distinguishing between non-defective and defective chips;
a dicing process for separating one by one the plurality of chips in the wafer inspected by said probe inspection process;
a selection process for sorting out the chips separated by said dicing process into non-defective and defective chips in accordance with a failure information provided from said wafer aging process and that provided from said probe inspection process; and
a feedback process for analyzing the failure information provided from said wafer aging process and that provided from said probe inspection process, estimating a cause of failure and feeding back the result of the estimation of the cause of failure to said wafer completion process, wherein said feedback process includes a failure map making process for making a failure map in accordance with said failure information, and an analysis process for analyzing which processing steps in said wafer completion process causes a failure, on the basis of said failure map.

13. A method for manufacturing a semiconductor device according to claim 12, wherein said failure map making process is carried out for each failure mode.

14. A method for manufacturing a semiconductor device according to claim 2, wherein a plurality of wafers are formed in a production lot, and said failure map making process is carried out for each production lot.

15. A method for manufacturing a semiconductor device according to claim 12, wherein said analysis process analyzes a pattern of the failure map made by said failure map making process.

16. A method for manufacturing a semiconductor device according to claim 12, wherein in said wafer aging process a power source voltage and a signal voltage are supplied from power supplying electrodes for operating the chips in said wafer while suppressing noises using a noise suppressing multilayer ceramic chip capacitor.

17. A method for manufacturing a semiconductor device according to claim 16, wherein in said wafer aging process an electric current flowing through said power supplying electrodes is limited by a current limiting, thick or thin film resistor.

18. A method for manufacturing a semiconductor device according to claim 12, wherein in said wafer aging process, power supplying electrodes and an anisotropic electroconductive material are connected together electrically, and said anisotropic electroconductive material and the chips in said wafer are also connected together electrically, said anisotropic electroconductive material being interposed between the chips and the power supplying electrodes.

19. A method for manufacturing a semiconductor device according to claim 12, wherein in said wafer aging process, power supplying electrodes on a power supply board, and said chips in the wafer, are registered with each other, by the registration of (1) an alignment mark exposed through a through hole in the power supply board and formed simultaneously with the power supplying electrodes on the power supply board having a plurality of said power supplying electrodes, with (2) an alignment mark formed on said wafer in said wafer completion process.

20. A method for manufacturing a semiconductor device according to claim 12, wherein in said wafer aging process, a plurality of said wafers and a plurality of power supply boards are stacked alternately, and a load is applied to all of said wafers and said power supply boards at a same time.

21. A method for manufacturing a semiconductor device according to claim 20, wherein said load is applied to the plurality of said wafers and the plurality of power supply boards while the plurality of wafers and the plurality of power supply boards are stacked alternatively, the load being applied in a direction in which the plurality of said wafers and the plurality of power supply boards are stacked alternatively.

22. A method for manufacturing a semiconductor device according to claim 12, wherein in said wafer aging process, said wafer and a power supply board are put one upon the other in a container having a pressure block, then the internal gas of said container is discharged, and due to a pressure difference between the atmospheric pressure and the internal pressure of said container, said pressure block is pressed against said wafer or said power supply board to make electrical conduction between the chips in said wafer and power supplying electrodes of said power supply board.

* * * * *